(12) United States Patent
Masuda et al.

(10) Patent No.: US 7,851,902 B2
(45) Date of Patent: Dec. 14, 2010

(54) RESIN-SEALED SEMICONDUCTOR DEVICE, MANUFACTURING METHOD THEREOF, BASE MATERIAL FOR THE SEMICONDUCTOR DEVICE, AND LAYERED AND RESIN-SEALED SEMICONDUCTOR DEVICE

(75) Inventors: Masachika Masuda, Shinjuku-Ku (JP); Chikao Ikenaga, Shinjuku-Ku (JP); Koji Tomita, Kawagoe (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 12/302,113

(22) PCT Filed: Jun. 22, 2007

(86) PCT No.: PCT/JP2007/062582

§ 371 (c)(1),
(2), (4) Date: Nov. 24, 2008

(87) PCT Pub. No.: WO2007/148782

PCT Pub. Date: Dec. 27, 2007

(65) Prior Publication Data

US 2009/0140411 A1   Jun. 4, 2009

(30) Foreign Application Priority Data

Jun. 22, 2006   (JP) .............................. 2006-173032

(51) Int. Cl.
*H01L 23/48* (2006.01)
(52) U.S. Cl. ................. 257/692; 257/734; 257/E23.01; 438/106
(58) Field of Classification Search ........... 257/692, 257/734–736, 739, 750, E21.499, E21.01; 438/106, 584, 611
See application file for complete search history.

(56) References Cited

U.S. PATENT DOCUMENTS

| | | | | |
|---|---|---|---|---|
| 6,630,729 B2 * | 10/2003 | Huang | ....................... | 257/676 |
| 2004/0232534 A1 * | 11/2004 | Seki et al. | ................... | 257/678 |
| 2005/0093117 A1 * | 5/2005 | Masuda et al. | .............. | 257/676 |
| 2005/0093118 A1 * | 5/2005 | Itou et al. | .................... | 257/676 |
| 2006/0079028 A1 * | 4/2006 | Takahashi | ................... | 438/123 |

FOREIGN PATENT DOCUMENTS

| | | | |
|---|---|---|---|
| JP | 11-260983 | A1 | 9/1999 |
| JP | 11-260989 | A1 | 9/1999 |
| JP | 11-307675 | A1 | 11/1999 |
| JP | 2000-031366 | A1 | 1/2000 |
| JP | 2002-033434 | A1 | 1/2002 |
| JP | 2003-046054 | A1 | 2/2003 |
| JP | 2003-158234 | A1 | 5/2003 |
| JP | 2004-319577 | A1 | 11/2004 |
| JP | 2004319577 | A * | 11/2004 |

* cited by examiner

*Primary Examiner*—Matthew S Smith
*Assistant Examiner*—Michele Fan
(74) *Attorney, Agent, or Firm*—Burr & Brown

(57) ABSTRACT

The present invention provides a resin-sealed semiconductor device, which includes a semiconductor element; a plurality of terminal members, each surrounding the semiconductor element and including an external terminal portion, an internal terminal portion and a connecting portion; bonding wires, each connecting the semiconductor element with the internal terminal portion; and a resin-sealing portion sealing the semiconductor element, terminal members and bonding wires. Each terminal member is composed of an inner thinned portion forming the internal terminal portion and an outer thickened portion forming the external terminal portion. A rear face of each internal terminal portion, and a front face, a rear face and an outer side face of each external terminal portion are exposed to the outside from the resin-sealing portion, respectively.

25 Claims, 10 Drawing Sheets

RESIN-SEALED SEMICONDUCTOR DEVICE, MANUFACTURING METHOD THEREOF, BASE MATERIAL FOR THE SEMICONDUCTOR DEVICE, AND LAYERED AND RESIN-SEALED SEMICONDUCTOR DEVICE

BACKGROUND OF THE INVENTION

1. Field of the Invention

The present invention relates to a small-size and thin-type resin-sealed semiconductor device including terminal members, and a layered and resin-sealed semiconductor device having a structure in which such semiconductor devices are layered.

2. Background Art

In recent years, for miniaturization of the electronic equipment, packaging of a semiconductor part into the electronic equipment with higher density has been required. With such a trend, miniaturization and thinning of the semiconductor part has progressed. Therefore, there is a need for a package including the resin-sealed semiconductor device that can be further thinned at a low cost.

Under such conditions, the resin-sealed semiconductor device, as described in JP11-307675A, having a structure in which both of upper and bottom faces of each connecting lead are exposed, and the resin-sealed semiconductor device, as described in JP11-260989A, having external terminals each formed by exposing a part of the connecting lead, have been proposed as ones corresponding to this thinning trend.

Meanwhile, development of forming a system LSI into one chip has intensively progressed. However, this approach is based on two-dimensional deployment of wirings, thus limiting an attempt to achieve higher-speed manufacturing by shortening each wiring. Under present conditions, this approach tends to increase the cost and time for development. More recently, in place of such an approach, it has been attempted to achieve the system LSI, by using a package, in which semiconductor elements are layered in three-dimensional directions. This package is also referred to as a system package.

In JP11-307675A, the layered and resin-sealed semiconductor device having the so-called stacked structure is also described. In this system, the resin sealed semiconductor devices also described in this patent document are layered, with both top and bottom faces of each connecting lead being exposed for electrical connection. However, the resin-sealed semiconductor device described in this patent document includes a die pad, thus making it difficult to achieve a sufficiently thinned form as currently needed.

On the other hand, the resin-sealed semiconductor device described in JP11-260989A cannot have such a stacked structure as described above.

In addition, another packaged form, in which the semiconductor elements (or chips) are layered, is described in JP2002-33434A. However, this system may tend to decrease the degree of freedom in the structure, limiting applicability for a general purpose.

Patent Document 1: JP11-307675A
Patent Document 2: JP11-260989A
Patent Document 3: JP2002-33434A As described above, in recent years, the miniaturization and thinning of the semiconductor part has progressed, and now there is a need for the package that can achieve further thinning of such a part at a low cost. Additionally, in order to construct the system package by using the so-called stacked structure in which a plurality of resin-sealed semiconductor devices are layered one on another, it is necessary to make each resin-sealed semiconductor device into a further thinned form.

SUMMARY OF THE INVENTION

The present invention is intended to address the above challenges, and therefore it is an object thereof to provide a new resin-sealed semiconductor device that can be further thinned at a low cost. More specifically, it is an object of this invention to provide a new layered and resin-sealed semiconductor device having the so-called stacked structure, in which a plurality of resin-sealed semiconductor devices are layered one on another.

Another object of this invention is to provide a manufacturing method for such a thin-type resin-sealed semiconductor device and a base material for the semiconductor device.

The resin-sealed semiconductor device of the present invention preferably includes: a semiconductor element; a plurality of terminal members, each surrounding the semiconductor element and including an external terminal portion connected with an external circuit, an internal terminal portion connected with the semiconductor element, and a connecting portion connecting the external terminal portion with the internal terminal portion; bonding wires, each electrically connecting the semiconductor element with the internal terminal portion of each terminal member; and a resin-sealing portion sealing the semiconductor element, terminal members and bonding wires, wherein each terminal member has a flat rear face and two stepwise front faces and is composed of an inner thinned portion forming the internal terminal portion and an outer thickened portion forming the external terminal portion, and wherein a rear face of each internal terminal portion, a front face of each external terminal portion, a rear face of the external terminal portion and an outer side face of the external terminal portion are respectively exposed to the outside from the resin-sealing portion.

In the resin-sealed semiconductor device of this invention, each terminal member is formed by etching a material for processing, wherein the external terminal portion is formed into the thickened portion by keeping a thickness of the material, while the internal terminal portion is formed into the thinned portion by half-etching a front face of the material.

In the resin-sealed semiconductor device of this invention, a notched portion is formed in an outer upper portion of each external terminal portion, wherein the periphery of the front face of the external terminal portion is located inside the outer side face thereof.

In the resin-sealed semiconductor device of this invention, the resin-sealing portion is filled in the notched portion of the external terminal portion.

In the resin-sealed semiconductor device of this invention, an acute angle is formed between the front face and an inner side face of each internal terminal portion, in an inner cross section parallel to a longitudinal direction thereof.

In the resin-sealed semiconductor device of this invention, a recess is formed in the inner side face of each internal terminal portion, in the inner cross section parallel to a longitudinal direction thereof.

In the resin-sealed semiconductor device of this invention, each internal terminal portion includes the material for processing and a plated layer formed on the material, such that the recess is formed in the inner side face of the internal terminal portion, in the inner cross section thereof.

In the resin-sealed semiconductor device of this invention, a cross-sectional shape orthogonal to the longitudinal direction of each internal terminal portion is an inverted trapezoidal shape.

In the resin-sealed semiconductor device of this invention, an inner end portion of each internal terminal portion is tapered when seen in a plan view thereof.

In the resin-sealed semiconductor device of this invention, a face-roughening process is provided to faces of the internal terminal portion and external terminal portion of each terminal member that will be contacted with the resin-sealing portion.

In the resin-sealed semiconductor device of this invention, the maximum height roughness Ry (JISBO601-1994) of each face subjected to the face-roughening process is within a range of from 1 μm to 2 μm.

In the resin-sealed semiconductor device of this invention, each terminal member is formed from Cu, a Cu-based alloy or 42% Ni—Fe alloy.

In the resin-sealed semiconductor device of this invention, a metal-plated layer for electrical connection, which is selected from the group consisting of a solder-plated layer, a gold-plated layer, a silver-plated layer, a palladium-plated layer and a tin-plated layer, is provided to the front face of each internal terminal portion and the front and rear faces of each external terminal portion.

In the resin-sealed semiconductor device of this invention, the thickness of the semiconductor element is 100 μm or less.

In the resin-sealed semiconductor device of this invention, the semiconductor device is of a QFN type.

Alternatively, the layered and resin-sealed semiconductor device of the present invention preferably includes two or more resin-sealed semiconductor devices, each being vertically layered one on another and electrically connected with one another, wherein each resin-sealed semiconductor device includes: a semiconductor element; a plurality of terminal members, each surrounding the semiconductor element and including an external terminal portion connected with an external circuit, an internal terminal portion connected with the semiconductor element, and a connecting portion connecting the external terminal portion with the internal terminal portion; bonding wires, each electrically connecting the semiconductor element with the internal terminal portion of each terminal member; and a resin-sealing portion sealing the semiconductor element, terminal members and bonding wires, wherein each terminal member has a flat rear face and two stepwise front faces and is composed of an inner thinned portion forming the internal terminal portion and an outer thickened portion forming the external terminal portion, and wherein a rear face of each internal terminal portion, a front face of each external terminal portion, a rear face of the external terminal portion and an outer side face of the external terminal portion are respectively exposed to the outside from the resin-sealing portion.

Alternatively, the layered and resin-sealed semiconductor device of the present invention preferably includes a plurality of sets of two or more resin-sealed semiconductor devices, with each resin-sealed semiconductor device being vertically layered one on another and electrically connected with one another, and each set of the resin-sealed semiconductor devices being electrically connected with one another via a side face thereof, wherein each resin-sealed semiconductor device includes: a semiconductor element; a plurality of terminal members, each surrounding the semiconductor element and including an external terminal portion connected with an external circuit, an internal terminal portion connected with the semiconductor element, and a connecting portion connecting the external terminal portion with the internal terminal portion; bonding wires, each electrically connecting the semiconductor element with the internal terminal portion of each terminal member; and a resin-sealing portion sealing the semiconductor element, terminal members and bonding wires, wherein each terminal member has a flat rear face and two stepwise front faces and is composed of an inner thinned portion forming the internal terminal portion and an outer thickened portion forming the external terminal portion, and wherein a rear face of each internal terminal portion, a front face of each external terminal portion, a rear face of the external terminal portion and an outer side face of the external terminal portion are respectively exposed to the outside from the resin-sealing portion.

Alternatively, the base material for the semiconductor device of the present invention preferably includes: a plurality of terminal members, each including an external terminal portion, an internal terminal portion, and a connecting portion connecting the external terminal portion with the internal terminal portion, wherein each terminal member has a flat rear face and two stepwise front faces and is composed of an inner thinned portion forming the internal terminal portion and an outer thickened portion forming the external terminal portion.

In the base material for the semiconductor device of this invention, each terminal member is formed by etching a material for processing, wherein the external terminal portion is formed into the thickened portion by keeping a thickness of the material, while the internal terminal portion is formed into the thinned portion by half-etching or deep-etching a front face of the material.

In the base material for the semiconductor device of this invention, a notched portion is formed in an outer upper portion of each external terminal portion, wherein the periphery of a front face of the external terminal portion is located inside the outer side face thereof.

In the base material for the semiconductor device of this invention, an acute angle is formed between the front face and an inner side face of each internal terminal portion, in an inner cross section parallel to a longitudinal direction thereof.

In the base material for the semiconductor device of this invention, a recess is formed in the inner side face of each internal terminal portion, in the inner cross section thereof.

In the base material for the semiconductor device of this invention, the internal terminal portion includes the material for processing and a plated layer formed on the material, such that the recess is formed in the inner side face of each internal terminal portion, in the inner cross section thereof.

In the base material for the semiconductor device of this invention, a cross-sectional shape orthogonal to the longitudinal direction of each internal terminal portion is an inverted trapezoidal shape.

In the base material for the semiconductor device of this invention, an inner end portion of each internal terminal portion is tapered when seen in a plan view thereof.

In the base material for the semiconductor device of this invention, a face-roughening process is provided to faces of the internal terminal portion and external terminal portion of each terminal member that will be contacted with the resin-sealing portion.

In the base material for the semiconductor device of this invention, the maximum height roughness Ry (JISBO601-1994) of each face subjected to the face-roughening process is within a range of from 1 μm to 2 μm.

In the base material for the semiconductor device of this invention, each terminal member is formed from Cu, a Cu-based alloy or 42% Ni—Fe alloy.

In the base material for the semiconductor device of this invention, a metal-plated layer for electrical connection, which is selected from the group consisting of a solder-plated layer, a gold-plated layer, a silver-plated layer, a palladium-plated layer and a tin-plated layer, is provided to the front face of each internal terminal portion and the front and rear faces of each external terminal portion.

Alternatively, the manufacturing method related to the present invention is provided for manufacturing a resin-sealed semiconductor device, the resin-sealed semiconductor device including: a semiconductor element; a plurality of terminal members, each surrounding the semiconductor element and including an external terminal portion connected with an external circuit, an internal terminal portion connected with the semiconductor element, and a connecting portion connecting the external terminal portion with the internal terminal portion; bonding wires, each electrically connecting the semiconductor element with the internal terminal portion of each terminal member; and a resin-sealing portion sealing the semiconductor element, terminal members and bonding wires, wherein each terminal member has a flat rear face and two stepwise front faces and is composed of an inner thinned portion forming the internal terminal portion and an outer thickened portion forming the external terminal portion, and wherein a rear face of each internal terminal portion, a front face of each external terminal portion, a rear face of the external terminal portion and an outer side face of the external terminal portion are respectively exposed to the outside from the resin-sealing portion, wherein the manufacturing method comprises the steps of: preparing a processing sheet by etching a material for processing, the processing sheet including a plurality of connecting terminal members each composed of a pair of terminal members, with the external terminal members being respectively connected together; drawing and holding a rear face of the processing sheet with vacuum by using a vacuum drawing plate, and then mounting each semiconductor element onto the vacuum drawing plate between the connecting terminal members, while connecting each connecting terminal member with the semiconductor element by using the bonding wire; removing the processing sheet from the vacuum drawing plate, providing mold-fixing plates to front and rear faces of the processing sheet via molding tapes, and then filling a sealing resin in a space between the mold-fixing plates, so as to form the resin-sealing portion; removing the molding tapes and mold-fixing plates from front and rear faces of the resin-sealing portion; and attaching a cutting tape to the resin-sealing portion, and then cutting the resin-sealing portion for each semiconductor element, wherein each connecting terminal member is cut at an intermediate portion between the external terminal portions thereof when the resin-sealing portion is cut, so as to separate the connecting terminal members into each terminal member.

In the manufacturing method for the resin-sealed semiconductor device of this invention, the vacuum drawing plate has apertures, each provided throughout the entire face of the vacuum drawing plate and configured to draw the processing sheet with vacuum.

Alternatively, the manufacturing method related to the present invention is provided for manufacturing a resin-sealed semiconductor device, the resin-sealed semiconductor device including: a semiconductor element; a plurality of terminal members, each surrounding the semiconductor element and including an external terminal portion connected with an external circuit, an internal terminal portion connected with the semiconductor element, and a connecting portion connecting the external terminal portion with the internal terminal portion; bonding wires, each electrically connecting the semiconductor element with the internal terminal portion of each terminal member; and a resin-sealing portion sealing the semiconductor element, terminal members and bonding wires, wherein each terminal member has a flat rear face and two stepwise front faces and is composed of an inner thinned portion forming the internal terminal portion and an outer thickened portion forming the external terminal portion, and wherein a rear face of each internal terminal portion, a front face of each external terminal portion, a rear face of the external terminal portion and an outer side face of the external terminal portion are respectively exposed to the outside from the resin-sealing portion, wherein the manufacturing method preferably includes the steps of: preparing a processing sheet by etching a material for processing, the processing sheet including a plurality of connecting terminal members each composed of a pair of terminal members, with the external terminal members being respectively connected together; attaching a molding tape to a rear face of the processing sheet so as to hold the processing sheet by using the molding tape, and then mounting each semiconductor element onto the molding tape between the connecting terminal members, while connecting each connecting terminal member with the semiconductor element by using the bonding wire; attaching another molding tape to a front face of the processing sheet; providing mold-fixing plates to the front and rear faces of the processing sheet via the molding tapes, and then filling a sealing resin in a space between the mold-fixing plates, so as to form the resin-sealing portion; removing the mold-fixing plates from front and rear faces of the resin-sealing portion, attaching a cutting tape to the resin-sealing portion, and then cutting the resin-sealing portion for each semiconductor element, wherein each connecting terminal member is cut at an intermediate portion between the external terminal portions thereof when the resin-sealing portion is cut, so as to separate the connecting terminal members into each terminal member.

The above construction of the resin-sealed semiconductor device according to the present invention can provide a package including such a resin-sealed semiconductor device that can achieve a further thinned form of a semiconductor part at a lower cost. Especially, the method of this invention can manufacture such a significantly thinned resin-sealed semiconductor device that can achieve a system package having a stacked structure with higher productivity.

Thus, the method and/or resin-sealed semiconductor device of this invention can provide the new layered and resin-sealed semiconductor device that can be used for constructing the system package having the stacked structure.

Specifically, this invention provides such a resin-sealed semiconductor device that preferably includes: the semiconductor element; the plurality of terminal members, each surrounding the semiconductor element and including the external terminal portion connected with an external circuit, the internal terminal portion connected with the semiconductor element, and the connecting portion connecting the external terminal portion with the internal terminal portion; the bonding wires, each electrically connecting the semiconductor element with the internal terminal portion of each terminal member; and the resin-sealing portion sealing the semiconductor element, terminal members and bonding wires, wherein each terminal member has the flat rear face and two stepwise front faces and is composed of the inner thinned portion forming the internal terminal portion and the outer thickened portion forming the external terminal portion, and wherein the rear face of each internal terminal portion, front face of each external terminal portion, rear face and outer side face of the external terminal portion are respectively exposed to the outside from the resin-sealing portion.

Namely, such a structure can accommodate to decrease the thickness of the semiconductor element itself, thus achieving a significantly thinned form of the semiconductor part.

Additionally, the connection by the bonding wires can substantially enhance workability and reliability in the connection.

With the manufacturing method of this invention, which will be described later, the resin-sealed semiconductor devices can be collectively manufactured, with necessary elements and components being arranged on a suitable processing sheet, thus enhancing the productivity.

Additionally, since the thickness of the semiconductor element is set thinner than the thickness of each internal terminal portion, dropping of the melted wire can be avoided by bonding first the semiconductor element, upon connecting the semiconductor element with terminal faces of the respective internal terminal portions by using bonding wires.

Of course, such connection by the bonding wires can facilitate the connection between the semiconductor element and the respective internal portions.

In this invention, each terminal member is formed by etching the material for processing, wherein the external terminal portion is formed into the thickened portion having the thickness of the material, while the internal terminal portion is formed into the thinned portion of the material by half-etching or deep-etching one face of the material. In addition, in a cross section of a distal end of each internal terminal portion extending toward the semiconductor element, an acute angle is formed between such a half-etched or deep-etched face and each side face. Therefore, sealing properties of the resin sealing portion around the distal end of each internal terminal portion extending toward the semiconductor element can be enhanced against temperature change, as such improving moisture resistance.

Moreover, the amount of the sealing resin can be increased, corresponding to such an acute-angularly shaped distal end of each internal terminal portion. Such increase of the amount of the sealing resin used can significantly enhance structural stability and quality.

Especially, in the case of the QFN-type resin-sealed semiconductor device, such an acute-angularly shaped structure can securely enhance the quality, even though the number of the terminals is substantially increased.

Preferably, the acute angle formed at the distal end of each internal terminal portion is 85 degrees or less.

Furthermore, the inner end portion of each internal terminal portion is tapered when seen in a plan view thereof. Thus, the amount of the sealing resin can be further increased, due to such a tapered inner end portion. Therefore, the structural stability and quality can be further enhanced by such increase of the amount of the sealing resin used.

Additionally, the face-roughening process is provided to the faces of the internal terminal portion and external terminal portion of each terminal member that will be contacted with the sealing resin. Thus, adhesiveness between each terminal member and the sealing resin can be substantially enhanced.

In particular, such enhancement of the adhesiveness can be significantly effective when the maximum height roughness Ry (JISBO601-1994) of each face subjected to the face-roughening process is within the range of from 1 μm to 2 μm.

The notched portion is provided in the outer upper portion of each external terminal portion such that it extends from the front face to the outer side face of the external terminal portion. This structure can facilitate a cutting operation for separating the system into each semiconductor device.

In particular, there is no need to provide any additional cavity or cavities in a resin sealing step (or molding step). Instead, the molding step can be performed throughout by using a pair of flat mold-fixing plates that can grasp or hold the entire system on both sides. This approach can securely facilitate the molding step, substantially enhancing the productivity and workability.

As the terminal member, Cu, a Cu-based alloy, a 42% Ni—Fe alloy and the like can be mentioned.

Additionally, the metal-plated layer for electrical connection, which is selected from the group consisting of a solder-plated layer, a gold-plated layer, a silver-plated layer, a palladium-plated layer and a tin-plated layer, is provided to the front face of each internal terminal portion and the front and rear faces of each external terminal portion. Therefore, the reliability of the wire-bonding connection can be significantly improved.

In this invention, the rear face of each internal terminal portion, the front face of each external terminal portion, the rear face and outer side face of the external terminal portion are respectively exposed to the outside from the resin-sealing portion. Thus, the thickness of the sealing resin located over the diepadless type of semiconductor element in the package can be substantially increased, thereby facilitating further assembly and providing effective heat radiation.

With such a structure, the layered and resin-sealed semiconductor device of this invention can be provided in the stacked structure composed of a plurality of resin-sealed semiconductor devices.

According to the manufacturing method for the resin-sealed semiconductor device of this invention, the thin-type resin-sealed semiconductor device can be manufactured with higher productivity.

As described above, the present invention can provide the package that can achieve a further thinned form of the semiconductor part at a low cost. Especially, this invention can provide such a significantly thinned resin-sealed semiconductor device that can achieve the system package having the stacked structure.

Thus, this invention can provide the layered and resin-sealed semiconductor device that can achieve the system package having the stacked structure.

In addition, this invention can provide the manufacturing method for such a resin-sealed semiconductor device.

Other than the system package (System In Package and System On Package), the resin-sealed semiconductor device or layered and/or resin-sealed semiconductor device according to this invention can be effectively applied to a card module, an IC card, a POP (Point Of Purchase advertising) card, a substrate (e.g., a base material for manufacturing paper) and the like, especially in the case in which a significantly thinned form thereof is required.

DETAILED DESCRIPTION OF THE INVENTION EXAMPLES

Figure 1:
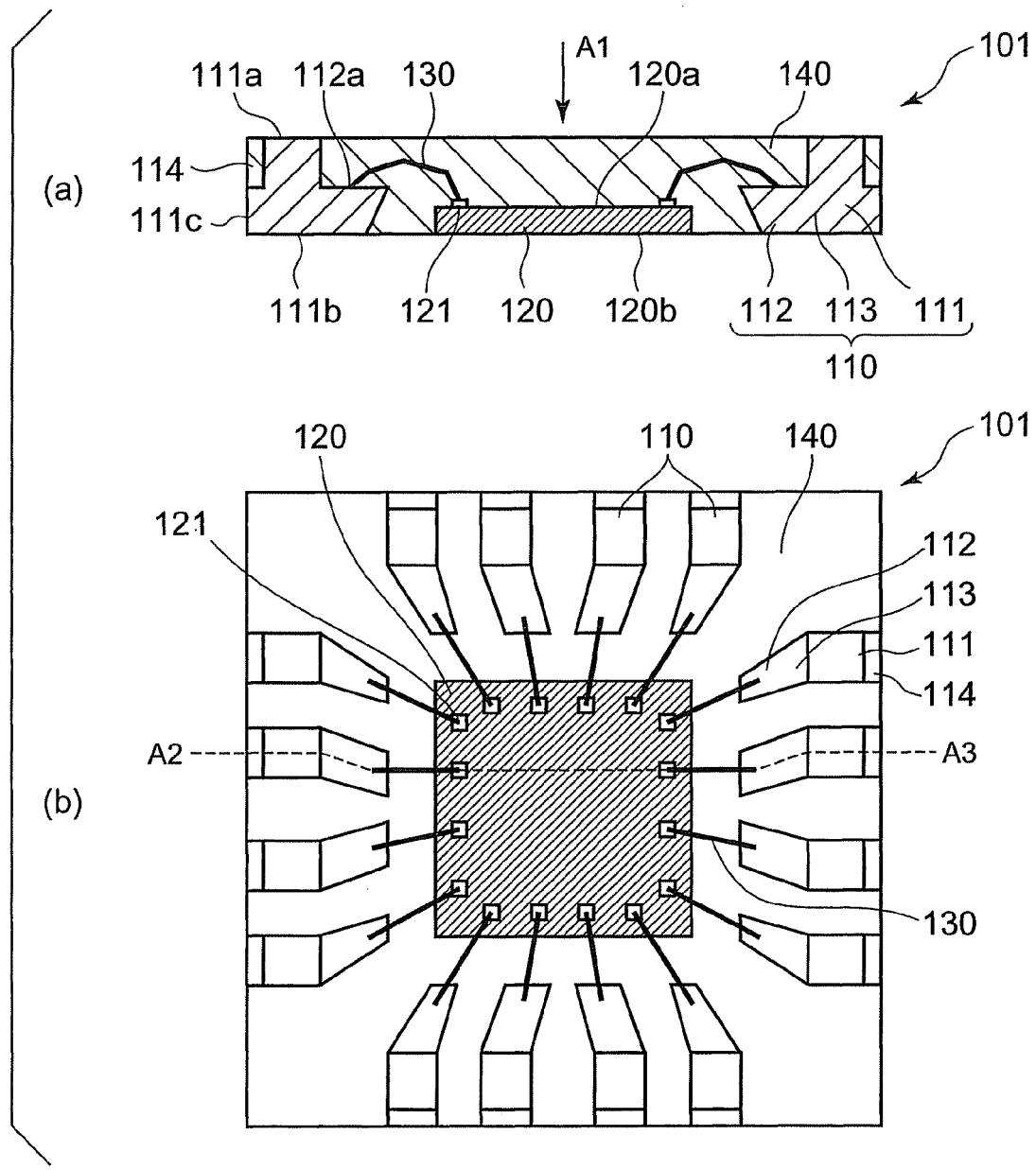
FIG. 1(a) is a schematic cross section showing a first embodiment of the resin-sealed semiconductor device of the present invention.
FIG. 1(b) is a perspective view of the semiconductor device when it is viewed in a direction A1 shown in FIG. 1(a).
Figure 2:
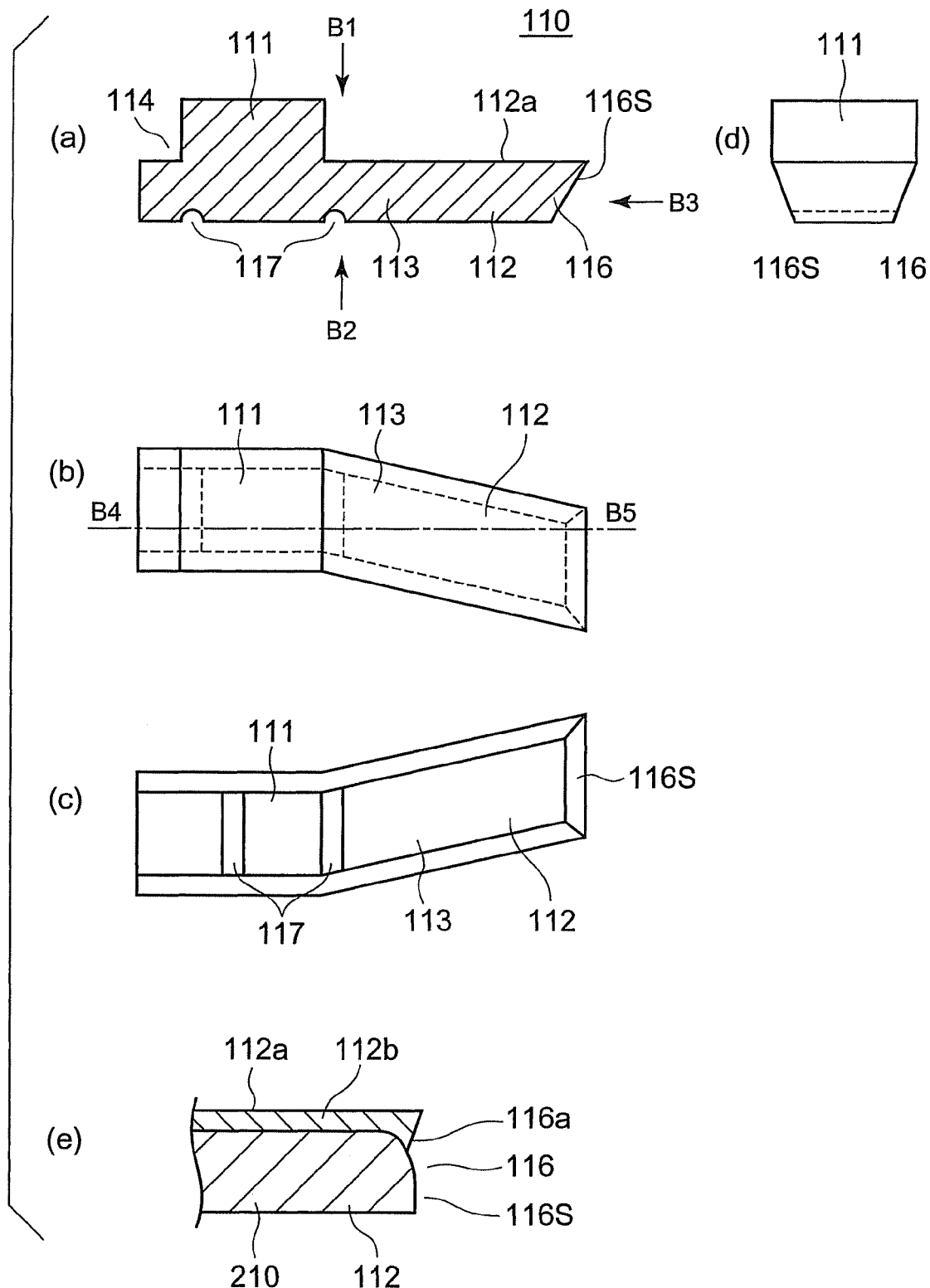
FIG. 2(a) is a cross section of one exemplary terminal member.
FIG. 2(b) is a schematic diagram of the terminal member when it is viewed in a direction B1 depicted in FIG. 2(a)
FIG. 2(c) is a diagram of the terminal member when it is viewed in a direction B2 depicted in FIG. 2(a)
FIG. 2(d) is a diagram of the terminal member when it is viewed in a direction B3 depicted in FIG. 2(*a*), and FIG. 2(*e*) is a cross section showing a distal portion of one exemplary internal terminal portion.
Figure 3:
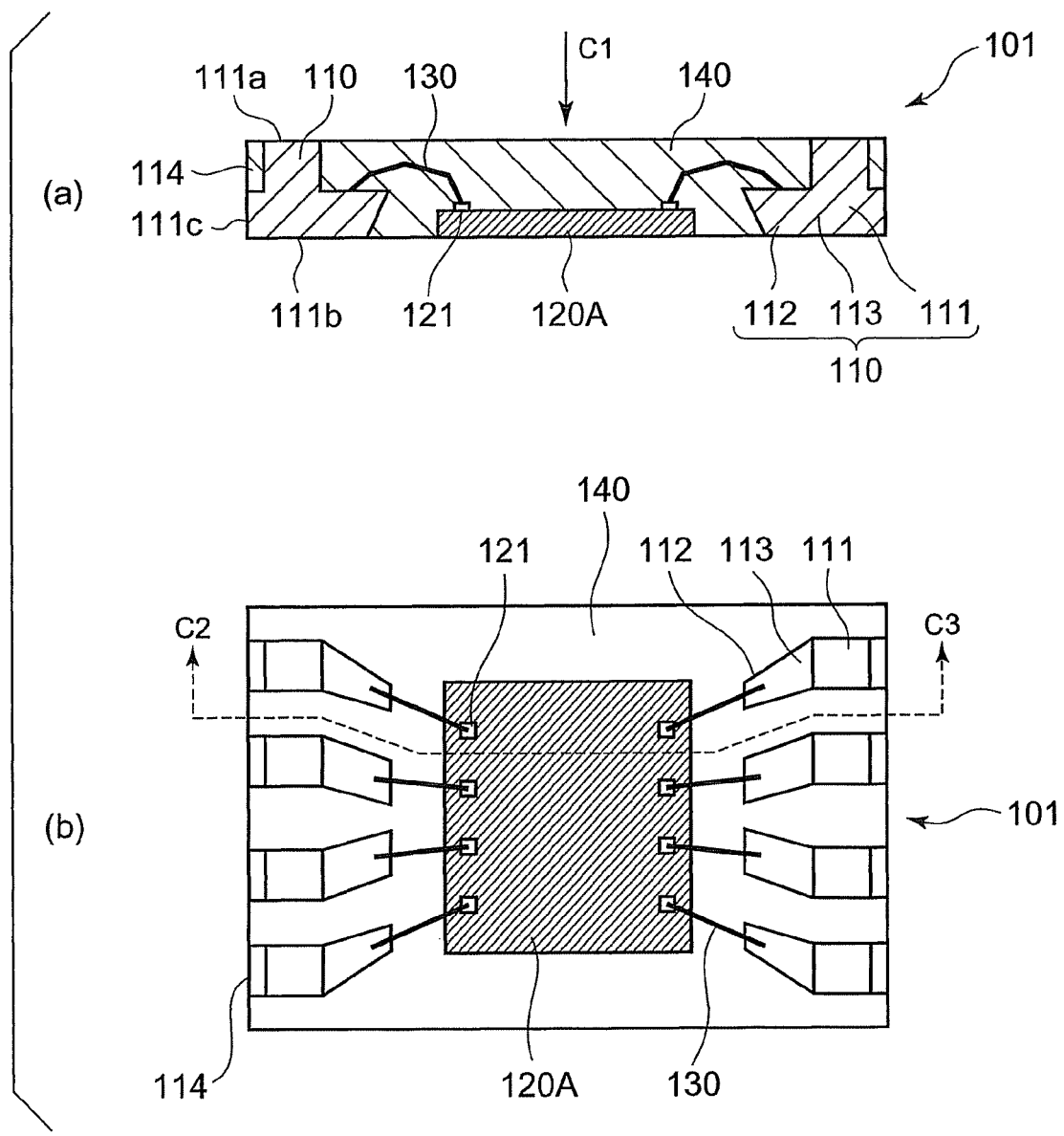
FIG. 3(*a*) is a schematic cross section showing a second embodiment of the resin-sealed semiconductor device of the present invention, and FIG. 3(*b*) is a perspective view of the semiconductor device when it is viewed in a direction C1 shown in FIG. 3(*a*).
Figure 4:
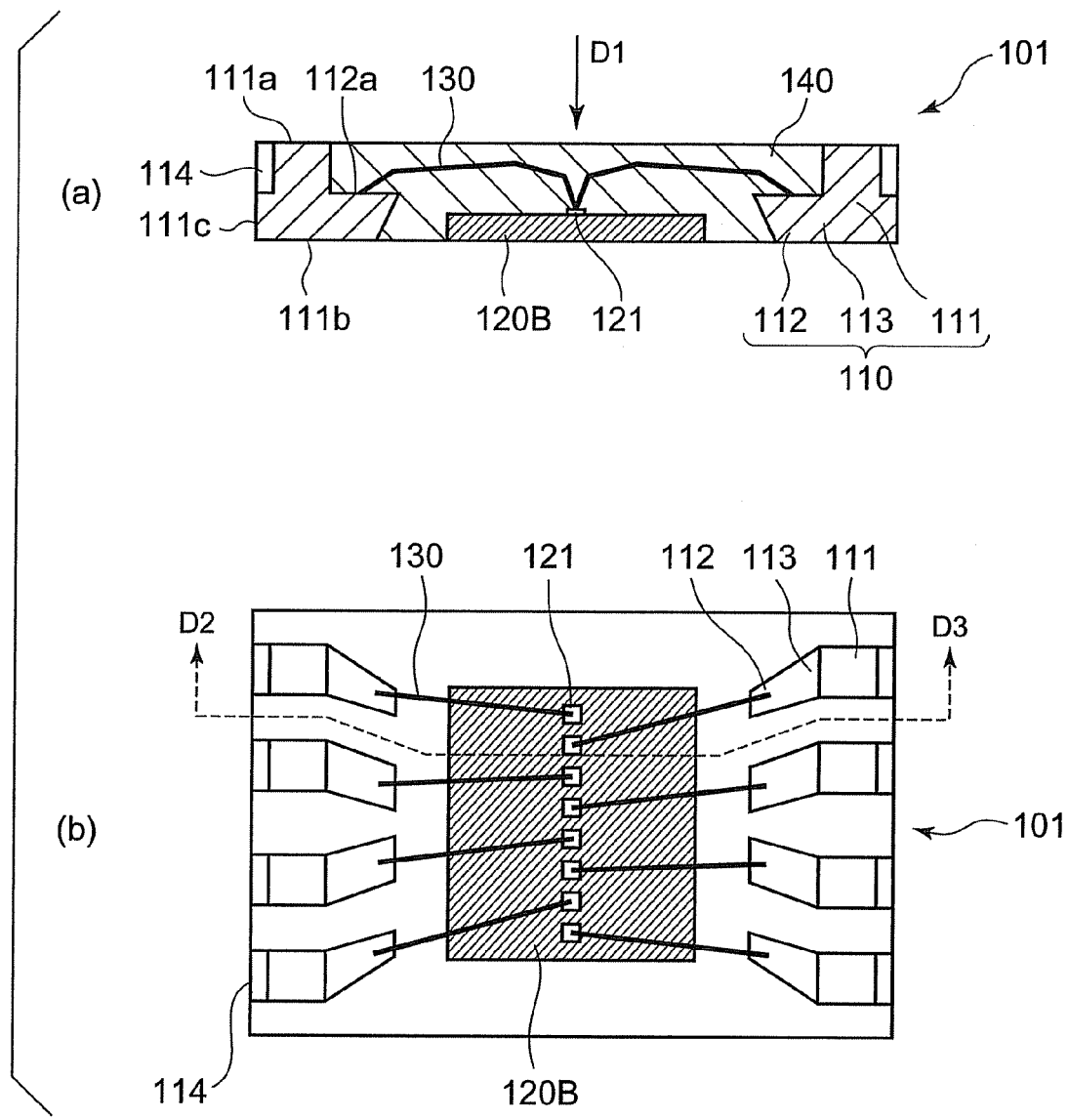
FIG. 4(*a*) is a schematic cross section showing a third embodiment of the resin-sealed semiconductor device of the present invention, and FIG. 4(*b*) is a perspective view of the semiconductor device when it is viewed in a direction D1 shown in FIG. 4(*a*).
Figure 5:
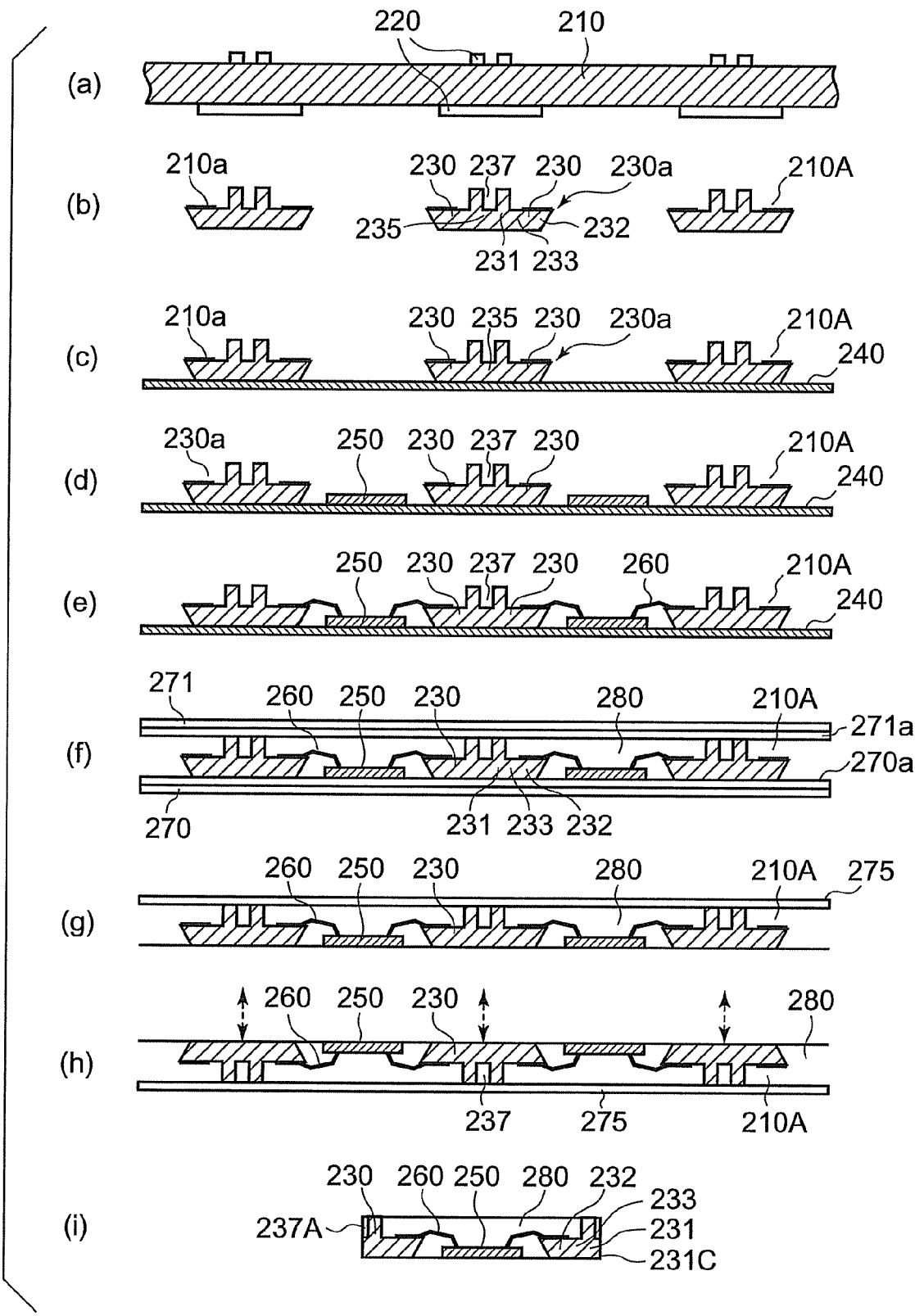
FIGS. 5(*a*), 5(*b*), 5(*c*), 5(*d*), 5(*e*), 5(*f*), 5(*g*), 5(*h*) and 5(*i*) are cross sections respectively showing one exemplary manufacturing procedure of a first embodiment of the manufacturing method for the resin-sealed semiconductor device of the present invention.
Figure 6:
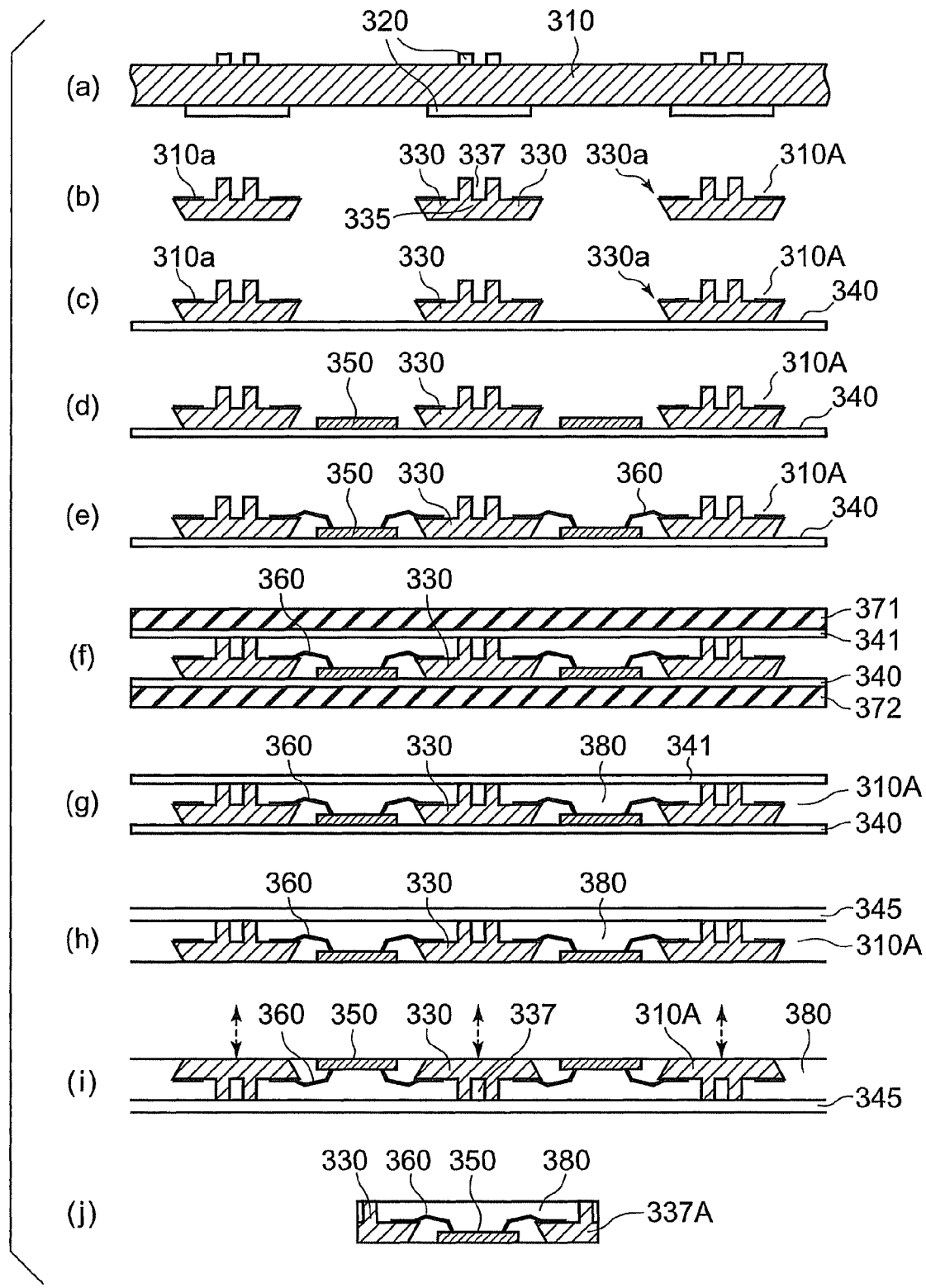
FIGS. 6(*a*), 6(*b*), 6(*c*), 6(*d*), 6(*e*), 6(*f*), 6(*g*), 6(*h*), 6(*i*) and 6(*j*) are cross sections respectively showing one exemplary manufacturing procedure of a second embodiment of the manufacturing method for the resin-sealed semiconductor device of the present invention.
Figure 7:
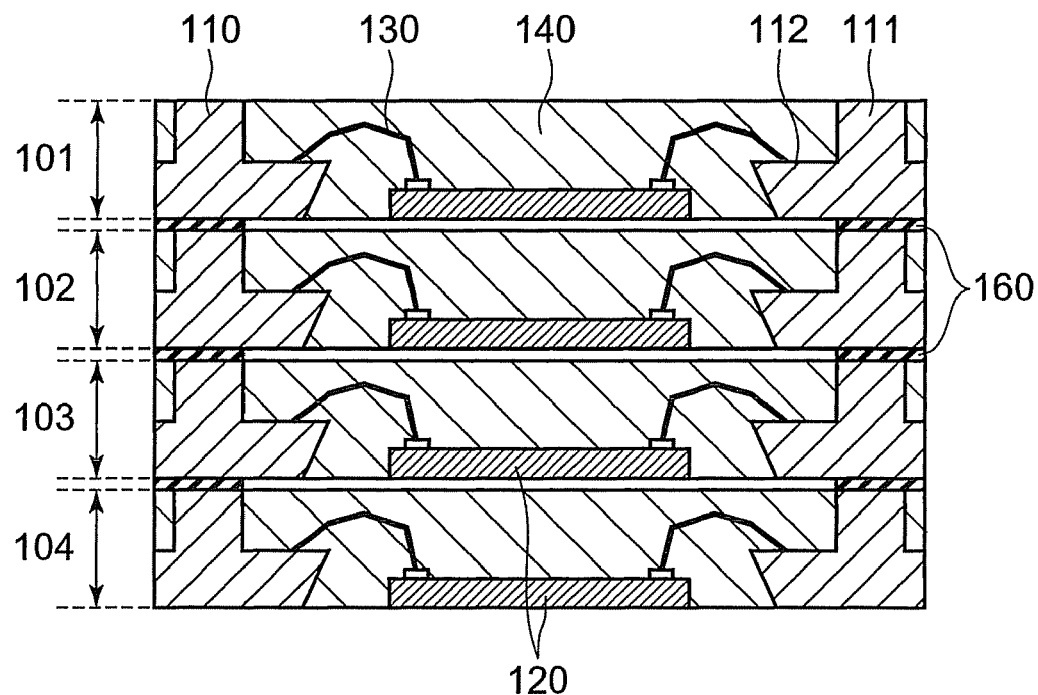
FIG. 7 is a cross section showing a first embodiment of the layered and resin-sealed semiconductor device of the present invention.
Figure 8:
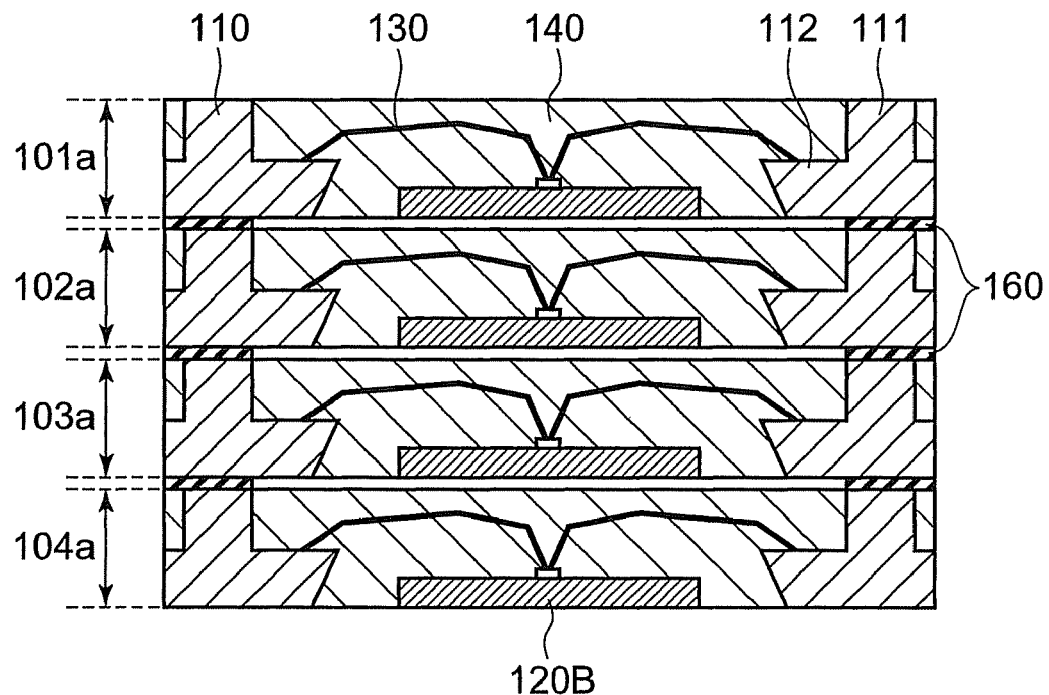
FIG. 8 is a cross section showing a second embodiment of the layered and resin-sealed semiconductor device of the present invention.
Figure 9:
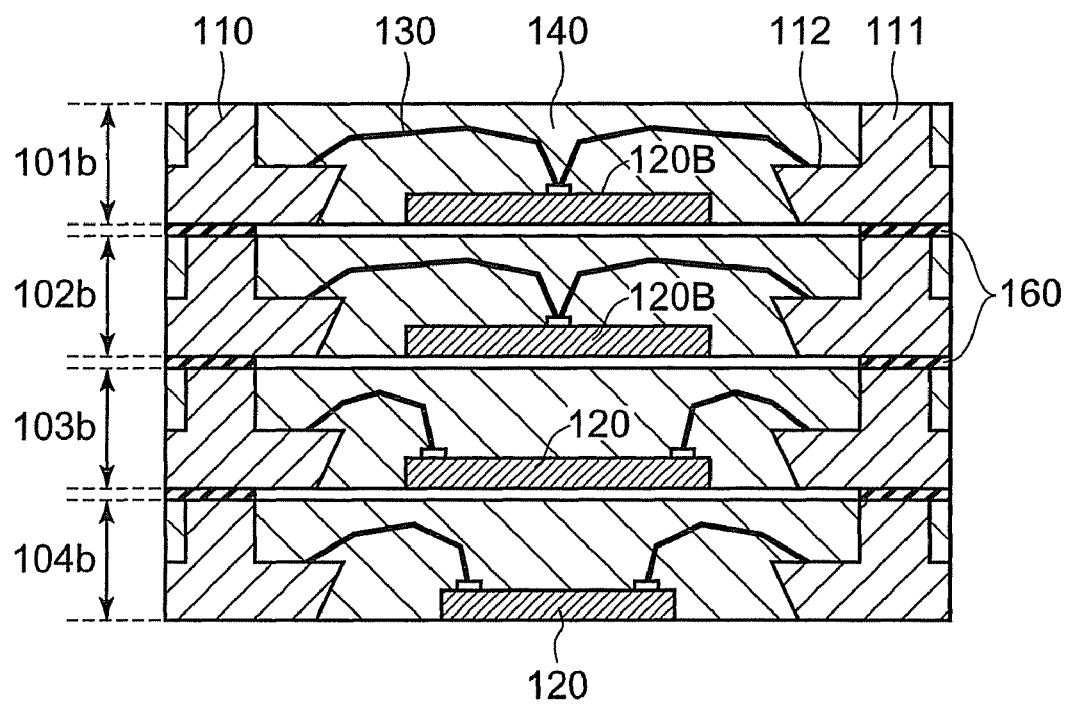
FIG. 9 is a cross section showing a third embodiment of the layered and resin-sealed semiconductor device of the present invention.
Figure 10:
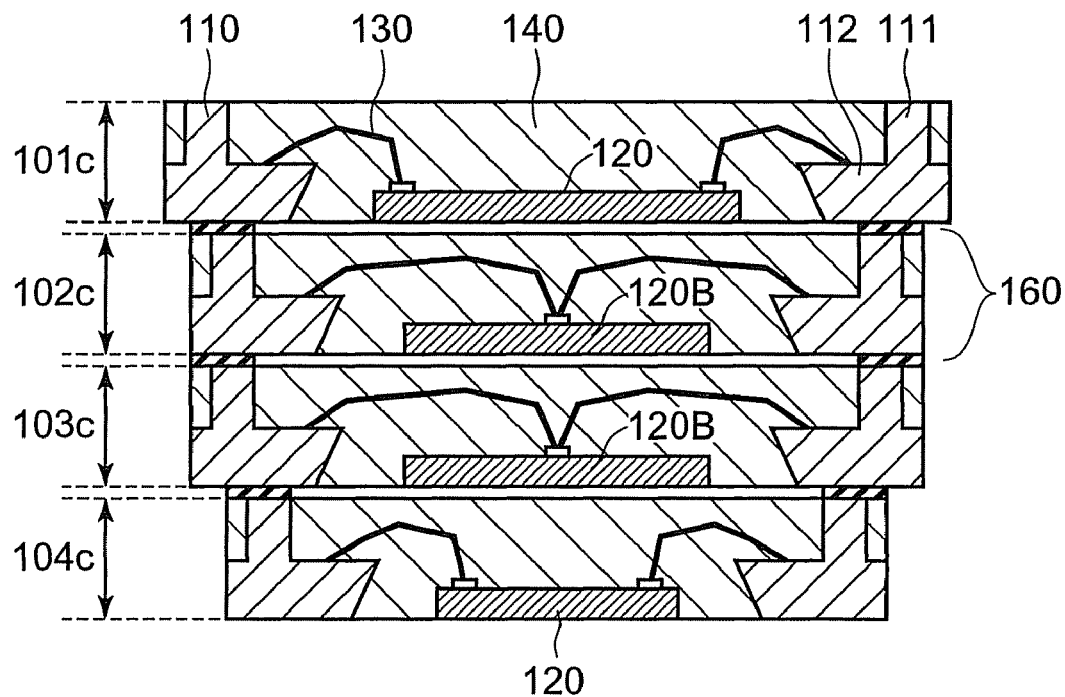
FIG. 10 is a cross section showing a fourth embodiment of the layered and resin-sealed semiconductor device of the present invention.
Figure 11:
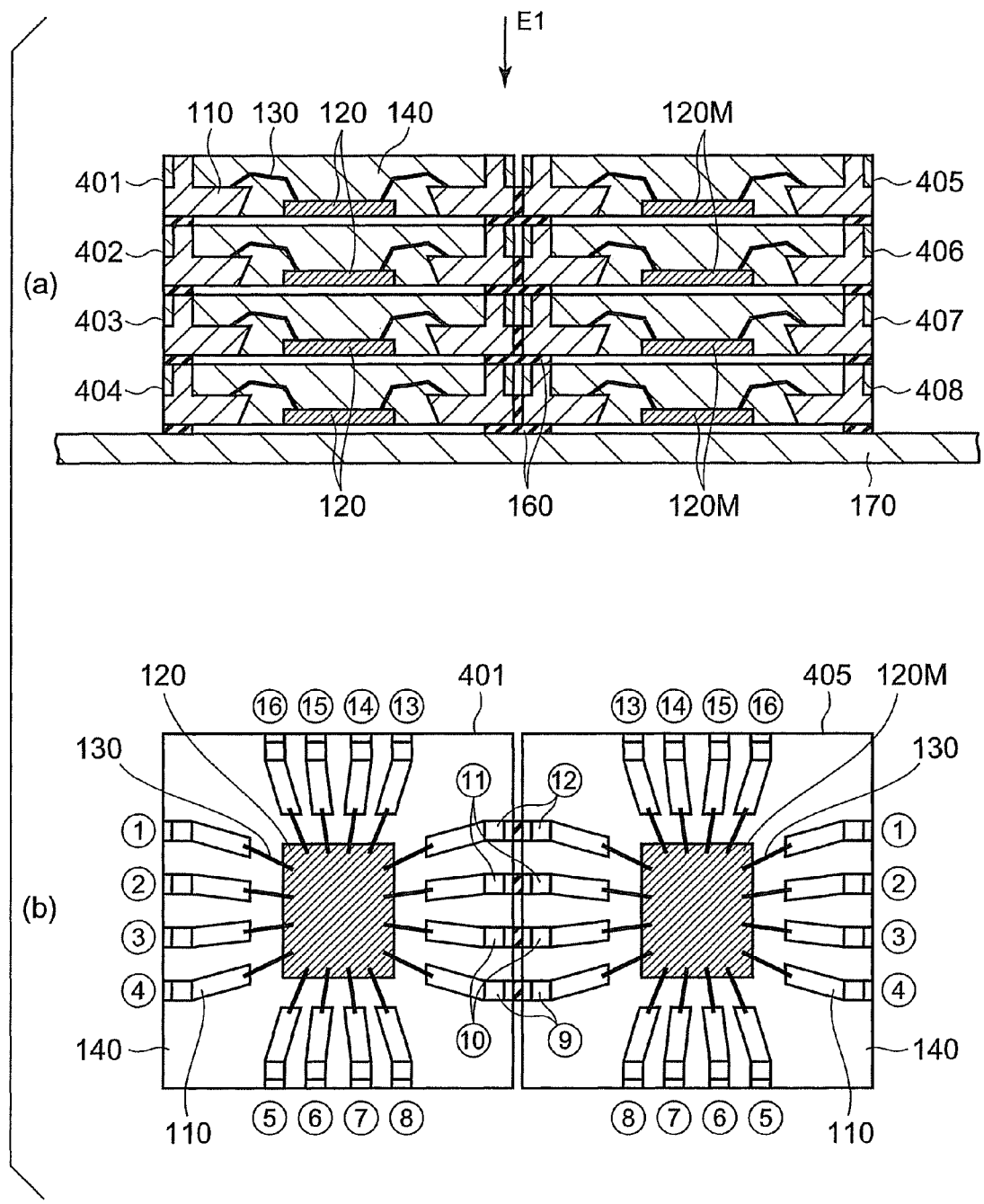
FIG. 11(*a*) is a cross section showing a fifth embodiment of the layered and resin-sealed semiconductor device of the present invention, and FIG. 11(*b*) is a diagram of the semiconductor device when it is viewed in a direction E1 shown in FIG. 11(*a*).
Figure 12:
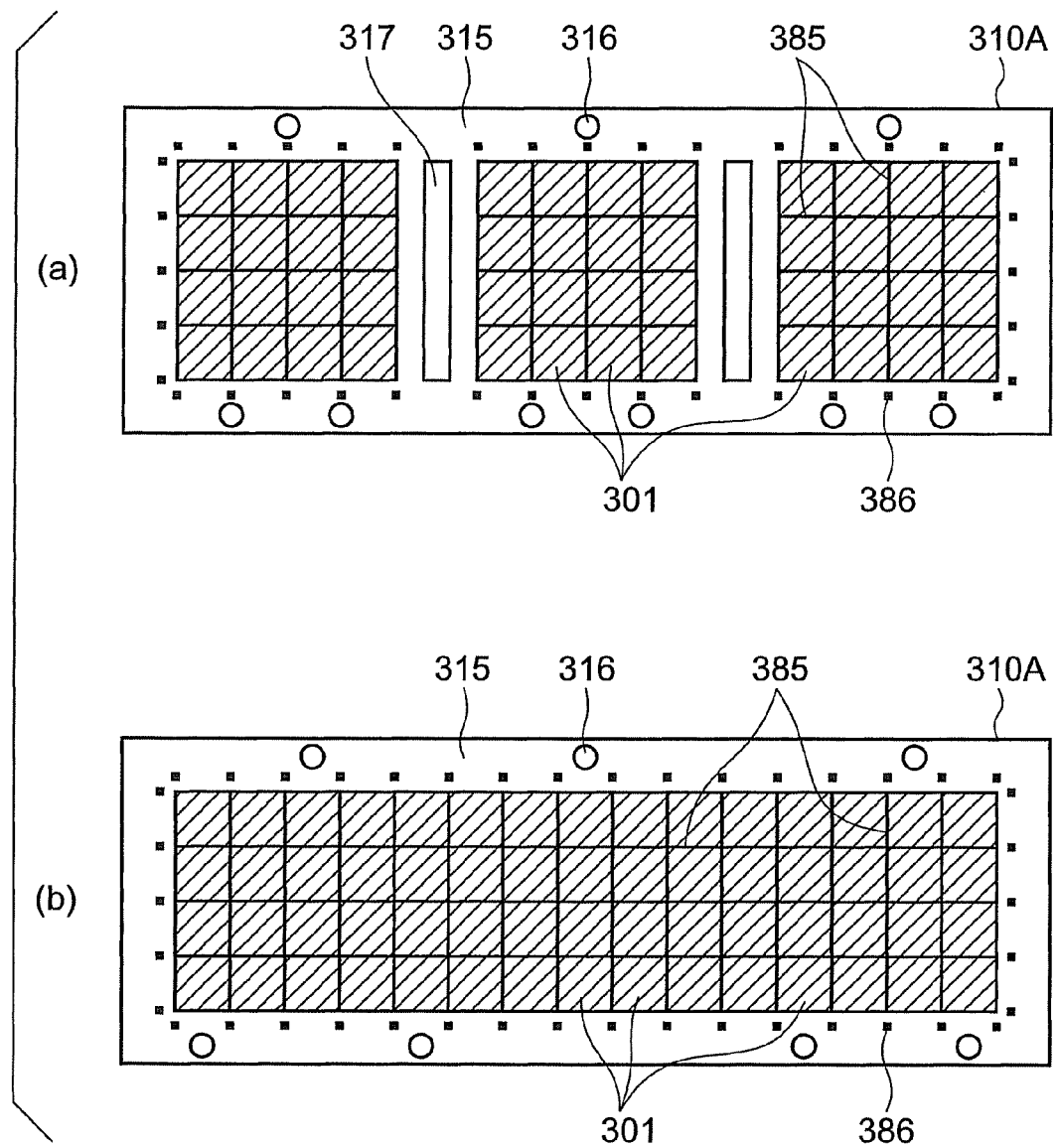
FIG. 12 is a schematic diagram showing a state in which the semiconductor device is cut by a dicing saw.

Hereinafter, several embodiments will be described with reference to the drawings. FIG. 1(*a*) is a schematic cross section showing a first embodiment of the resin-sealed semiconductor device of the present invention, and FIG. 1(*b*) is a perspective view of the semiconductor device when it is viewed in a direction A1 shown in FIG. 1(*a*). FIG. 2(*a*) is a cross section of the terminal member, FIG. 2(*b*) is a diagram of the terminal member when it is viewed in a direction B1 depicted in FIG. 2(*a*), FIG. 2(*c*) is a diagram of the terminal member when it is viewed in a direction B2 depicted in FIG. 2(*a*), and FIG. 2(*d*) is a diagram of the terminal member when it is viewed in a direction B3 depicted in FIG. 2(*a*). FIG. 3(*a*) is a schematic cross section showing a second embodiment of the resin-sealed semiconductor device of the present invention, and FIG. 3(*b*) is a perspective view of the semiconductor device when it is viewed in a direction C1 shown in FIG. 3(*a*). FIG. 4(*a*) is a schematic cross section showing a third embodiment of the resin-sealed semiconductor device of the present invention, and FIG. 4(*b*) is a perspective view of the semiconductor device when it is viewed in a direction D1 shown in FIG. 4(*a*). FIG. 5 is a cross section showing one exemplary manufacturing procedure of a first embodiment of the manufacturing method for the resin-sealed semiconductor device of the present invention, and FIG. 6 is a cross section showing one exemplary manufacturing procedure of a second embodiment of the manufacturing method for the resin-sealed semiconductor device of the present invention. FIG. 7 is a cross section showing a first embodiment of the layered and resin-sealed semiconductor device of the present invention, and FIG. 8 is a cross section showing a second embodiment of the layered and resin-sealed semiconductor device of the present invention. FIG. 9 is a cross section showing a third embodiment of the layered and resin-sealed semiconductor device of the present invention, and FIG. 10 is a cross section showing a fourth embodiment of the layered and resin-sealed semiconductor device of the present invention. FIG. 11(*a*) is a cross section showing a fifth embodiment of the layered and resin-sealed semiconductor device of the present invention, and FIG. 11(*b*) is a diagram of the semiconductor device when it is viewed in a direction E1 shown in FIG. 11(*a*). FIG. 12 is a diagram showing a state in which the semiconductor device is cut by a dicing saw.

More specifically, FIG. 1(*a*) shows a cross section taken along line A2-A3 depicted in FIG. 1(*b*), FIG. 3(*a*) shows a cross section taken along line C2-C3 depicted in FIG. 3(*b*), and FIG. 4(*a*) shows a cross section taken along line D2-D3 depicted in FIG. 4(*b*), respectively. To facilitate understanding, terminal portions of each semiconductor element are suitably omitted in FIGS. 5, 6 and 11, respectively.

Additionally, each arrow depicted in FIGS. 5(*h*) and 6(*i*) and indicating both upper and lower directions shows directions in which the dicing saw (or saws) is raised and lowered, respectively.

In FIGS. 1 through 12, reference numerals 101 to 104, 101*a* to 104*a*, 101*b* to 104*b* and 101*c* to 104*c* designate the resin-sealed semiconductor devices, respectively. 110 denotes each terminal portion, 111 designates each external terminal portion, 111*a*, 111*b* and 111*c* are terminal faces, respectively. 112 denotes each internal terminal portion, 112*a* designates each terminal face (half-etched face) of a front face, 113 designates each connecting portion, and 114 denotes each notched portion. 116 designates a distal end portion (inner end portion), 116S is a side face (of the distal end portion), and 117 designates each groove. 120, 120A and 120B denote the semiconductor elements (also referred to as semiconductor chips or merely referred to as chips), respectively, 120M designates each semiconductor element, and 121 denotes each terminal. 130 designates each bonding wire, 140 designates each resin-sealing portion, 160 denotes each solder paste, and 170 is a base material. 210 is a material for processing, 210A designates a processing sheet, 220 denotes each resist, 230 designates each terminal member, 231 designates each external terminal portion, 232 denotes each internal terminal portion, 233 denotes each connecting portion, 235 designates each support portion, 237 denotes each recess, 237A denotes each notched portion, and 240 is a flat porous plate (also referred to as the vacuum drawing plate). 250 designates each semiconductor element, 260 denotes each bonding wire, 270 and 271 designate mold-fixing plates, respectively, 270*a* and 271*a* designate molding tapes, respectively, 275 is a cutting tape (or dicing tape), and 280 is a resin-sealing portion. 301 denotes each resin-sealed semiconductor device used as a unit, 310 is the material for processing, 310A is the processing sheet, 316 designates each jig aperture, 317 is a long hole, 320 designates each resist, 330 denotes each terminal member, 335 designates each support portion (also referred to as the connecting portion), 337 denotes each recess, 340 and 341 designate the molding tapes, respectively, and 345 is the cutting tape (or dicing tape). 350 designates each semiconductor element, 360 denotes each bonding wire, 371 and 372 are the mold-fixing plates, respectively, 380 denotes the resin-sealing portion, 385 denotes each cutting line, 386 designates each cutting mark (e.g., a through-hole or dimple), and 401 to 408 designate the resin-sealed semiconductor devices, respectively.

First of all, the first embodiment of the resin-sealed semiconductor device according to the present invention will be described with reference to FIG. 1.

The resin-sealed semiconductor device 101 includes the semiconductor element 120; a plurality of terminal members 110, each surrounding the semiconductor element and including the external terminal portion 111 connected with an external circuit, the internal terminal portion 112 connected with the semiconductor element 120, and the connecting portion 113 connecting the external terminal portion 111 with the internal terminal portion 112; bonding wires 130, each electrically connecting each terminal 121 of the semiconductor element 120 with the internal terminal portion 112 of each terminal member 110; and the resin sealing portion 140 sealing the semiconductor device 120, terminal members 110 and boding wires 130.

Each terminal member 110 has a flat rear face 111b and two stepwise front faces 111a, 112a. Each internal terminal portion 112 is formed into a thinned portion, while each external terminal portion 111 is formed into a thickened portion.

The plurality of terminal members 110 are arranged along peripheral four sides of the semiconductor device 120, and the entire body of the resin-sealed semiconductor device 101 is shaped to fit in an area in which the plurality of terminal members 110 are arranged, and has a thickness not greater than that of the external terminal portion 111 of each terminal member 110. In this case, the resin-sealed semiconductor device 101 is formed into a QFN-type resin-sealed semiconductor device.

The internal terminal portion 112 of each terminal member 110 has the front face formed as the terminal face 112a, wherein the front face 111a and rear face 111b of each external terminal portion 111 and the front face 112a of each internal terminal portion 112 are formed into flat faces, respectively. Each terminal member 110 is arranged such that the internal terminal portion 112 thereof extends toward the semiconductor device 120. The front face 111a, rear face 111b and outer side face 111c of each external terminal portion 111 are exposed to the outside from the resin sealing portion 140, respectively. The front face of the semiconductor device 120 serves as a terminal face 120a, wherein the terminal face 120a faces in the same direction as the terminal face 112a of each internal terminal portion 112. The rear face 120b of the semiconductor device 120 is exposed to the outside from the resin sealing portion 140.

Each terminal member 110 is formed by etching the material 210, wherein the external terminal portion 111 is formed into the thickened portion of the material 210, while the internal terminal portion 112 is formed into the thinned portion by half-etching one side of the material 210. In a cross section of a distal end of each internal terminal portion 112 extending toward the semiconductor element 120 (or in an inner cross section parallel to a longitudinal direction of the internal terminal portion 112), the terminal face (or half-etched face) 112a of the internal terminal portion 112 and the inner side face 116S of the distal end portion (or inner end portion) 116 forms together an acute angle. When seen in a plan view, the inner end portion 116 of each internal terminal portion 112 extending toward the semiconductor element 120 is tapered. In the rear face of each terminal member, the grooves 117 are formed (see FIGS. 2(a) to 2(d)). In this example, a 0.2 mm-thickness copper (Cu) material is used as the material 210 for processing. This material is half-etched to form each internal terminal portion 112 having an approximately 0.1 mm thickness. In this case, the thickness of the semiconductor element 120 is 70 μm. As the material 210, a Cu-based alloy, 42-alloy (42% Ni—Fe alloy) or the like material can also be used. With use of such a thinned semiconductor device 120, the entire structure of this system can be significantly thinned. It should be appreciated that the material 210 may be deep-etched such that the 0.2 mm thickness of the material is reduced to ⅓ or less, and that the thickness of the internal terminal portion 112 may be equal to the thickness (70 μm) of the semiconductor element 120.

The semiconductor element 120 has the terminals 121 provided along its peripheral four sides, and the terminal members 110 are arranged around the four sides. In this case, the bonding wires 130 connect the terminals 121 of the semiconductor element 120 with the internal terminal portions 112 of the terminal members 110, respectively.

In this case, with such a tapered inner end portion 116 of the internal terminal portion 112 of each terminal member 110, sealing properties of the resin sealing portion 140 against temperature change can be enhanced, as such improving moisture resistance.

In addition, the thickness of the semiconductor element 120, which is set less than the thickness of each internal terminal portion 112, can successfully facilitate the bonding work.

Furthermore, the thickness of the resin sealing portion 140 can be increased as desired, as such the amount of the resin sealing portion 140 used can be increased as needed. This can significantly enhance structural stability and quality.

The resin-sealed semiconductor device 101 shown in FIGS. 1 and 2 is a thin-QFN type. Generally, the device of this type has a relatively large number of terminal members 110. Of the internal terminal portion 112 and external terminal portion 111 of each terminal member 110, each face that will be contacted with the resin sealing member 140 are respectively roughened (or subjected to a face-roughening process), with an aqueous hydrogen peroxide, into a roughened face 210b or 310b (see FIGS. 5 and 6).

Thus, further enhanced sealing properties or moisture resistance can be provided.

Preferably, the surface roughness of the roughened face 210 or 310b is within a range of from 1 μm to 2 μm, on the basis of the maximum height roughness Ry (see JISB0601-1994).

In this case, the measurement of the maximum height roughness Ry was conducted for a 200 μm length of each specimen.

As shown in FIGS. 1 and 2, the notched portion 114 is provided in an upper outer portion of each external terminal portion 111. Each notched portion 114 extends from the front face 111a to the outer side face 111c of each external terminal portion 111. This configuration can facilitates a process for cutting the resin sealing portion 140 for each semiconductor element 120.

In particular, there is no need to provide any additional cavity or cavities for a resin sealing step (or molding step). Instead, the molding step can be performed collectively by using a pair of flat mold-fixing plates. This can also enhance the productivity and workability.

Additionally, in FIGS. 1 and 2, a plated layer 210a or 310a for electrical connection may be provided on the front face 112a of the internal terminal portion 112 and/or front face 111a and rear face 111b of the external terminal portion 111 of each terminal member 110 (see FIGS. 5 and 6).

As the plated layer 210a or 310a for electrical connection, a suitable metal plated layer, such as a solder plated layer, a silver plated layer, a palladium plated layer, a tin plated layer and the like, can be mentioned.

In a cross section orthogonal to the longitudinal direction, the internal terminal portion 112 of each terminal member 110 has an inverted trapezoidal shape (see FIG. 2(d)). This inverted trapezoidal shape of each internal terminal portion 112 can serve as a wedge in the resin sealing portion 140, preventing unwanted release of each terminal member 110 from the resin sealing member 140.

In addition, with each notched portion 114 provided in the upper outer portion of each external terminal portion 111 as described above, the outer periphery of the front face 111a of the external terminal portion 111 is located inside relative to the outer side face 111c of the external terminal portion 111. Furthermore, the resin sealing portion 140 is filled in the notched portion 114 provided in the upper outer portion of each external terminal portion 111. Thus, the front face 111a of each external terminal portion 111 will be surrounded, both internally and externally, by the resin sealing portion 140. Accordingly, in the case of using the front face 111a of each external terminal portion 111 as one terminal face, the resin sealing portion 140 located both internally and externally to the front face 111a can repel a soldering ball material used for the terminal, as such securely positioning such a soldering material on the front face 111a of the external terminal portion 111. In this way, the soldering ball material can be successfully aligned.

Next, an alteration of the cross-sectional shape of each internal terminal portion 112 will be described. As shown in FIG. 2(e), in the inner cross section parallel to the longitudinal direction of the internal terminal portion 112, a recess 116a is formed in the inner side face 116S of the inner end portion 116 of the internal terminal portion 112. In FIG. 2(e), each internal terminal portion 112 is formed by etching the material 210, and a plated layer 112b is then provided on the etched material 210. As a result, the recess 116a is formed in the inner side face 116S by the material 210 and plated layer 112b.

Next, the second embodiment of the resin-sealed semiconductor device of the present invention will be described, with reference to FIGS. 3(a) and 3(b).

The resin-sealed semiconductor device 101 includes the plurality of terminal members 110, semiconductor element 120A having a thickness less than the thickness of each internal terminal portion 112, a predetermined number of terminals 121 provided on the semiconductor element 120A and bonding wires 130 each connecting each terminal 121 with each corresponding internal terminal portion 112. The plurality of terminal members 110 are arranged along peripheral opposite two sides of the semiconductor element 120A. The entire body of the resin-sealed semiconductor device 101 is shaped to fit in the area in which the plurality of terminal members 110 are arranged, and has a thickness not greater than that of the external terminal portion 111 of each terminal member 110. The semiconductor element 120A and bonding wires 130 are sealed by a resin, so as to form together a plate-mold type resin-sealed semiconductor device.

In this embodiment, as shown in FIG. 3(b), the semiconductor element 120A includes the terminals 121 arranged along opposite two sides of peripheral four sides of the element 120A, and the terminal members 110 are arranged along the two sides, opposite to the terminals 121. Further, each terminal 121 of the semiconductor element 120A is connected with each corresponding terminal member 110 by the bonding wire 130.

Except this point, the resin-sealed semiconductor device 101 is the same as the first embodiment shown in FIGS. 1 and 2, and each component is also the same as that used in the first embodiment.

Next, the third embodiment of the resin-sealed semiconductor device of the present invention will be described, with reference to FIGS. 4(a) and 4(b).

The resin-sealed semiconductor device 101 includes the plurality of terminal members 110, semiconductor element 120B having a thickness less than the thickness of each internal terminal portion 112, a predetermined number of terminals 121 provided on the semiconductor element 120B and bonding wires 130 each connecting each terminal 121 with each corresponding internal terminal portion 112. The plurality of terminal members 110 are arranged along peripheral opposite two sides of the semiconductor element 120B. The entire body of the resin-sealed semiconductor device 101 is shaped to fit in the area in which the plurality of terminal members 110 are arranged, and has a thickness not greater than that of the external terminal portion 111 of each terminal member 110. The semiconductor element 120B and bonding wires 130 are sealed by a resin, so as to form together the resin-sealed semiconductor device.

In this embodiment, the semiconductor element 120B includes the terminals 121 arranged in a line in an intermediate position between the opposite two sides, and the terminal members 110 are arranged along the two sides, opposite to the terminals 121. Further, each terminal 121 of the semiconductor element 120B is connected with each corresponding terminal member 110 by the bonding wire 130.

Except this point, this resin-sealed semiconductor device 101 is the same as the first embodiment shown in FIGS. 1 and 2, and each component is also the same as that used in the first embodiment.

With respect to the resin-sealed semiconductor device 101 shown in FIGS. 1 through 4, for example, four devices of the same size may be layered, one on another, so as to form the layered and resin-sealed semiconductor device.

For example, the resin-sealed semiconductor devices 101 shown in FIG. 1 may be layered, one on another, as shown in FIG. 7, while the resin-sealed semiconductor devices shown in FIG. 4 may be layered, one on another, as shown in FIG. 8.

In the case of such layered and resin-sealed semiconductor devices, the rear terminal face 111b of each external terminal portion 111 of an upper resin-sealed semiconductor device 101 is layered on the front terminal face 111a of each external terminal portion 111 of a next lower resin-sealed semiconductor device 101, wherein these terminal faces 111b and 111a are electrically connected together via the solder paste 160.

Alternatively, for example, as shown in FIG. 9, the layered and resin-sealed semiconductor device may be constructed, by using the resin-sealed semiconductor devices 101 shown in FIGS. 1 and 2 together with the resin-sealed semiconductor devices 101 shown in FIG. 4.

Otherwise, for example, as shown in FIG. 10, the layered and resin-sealed semiconductor device may be constructed, by using the resin-sealed semiconductor devices as shown in FIGS. 1 and 2 together with the resin-sealed semiconductor devices as shown in FIG. 4, wherein these semiconductor devices have different sizes, respectively.

It is noted that the resin-sealed semiconductor devices employed in the above layered construction may be connected together, by using the soldering ball materials, in place of using the soldering paste 160.

Furthermore, for example, as shown in FIG. 11(a), the layered and resin-sealed semiconductor device may be constructed, by using eight resin-sealed semiconductor devices 401 to 408 as shown in FIGS. 1 and 2. In this case, respective two of the eight semiconductor devices are first contacted and electrically connected, side by side, so as to prepare four sets of such two semiconductor devices. Then, these four sets of two semiconductor devices are layered one on another.

This construction can also be considered as one in which two sets of four layered resin-sealed semiconductor devices are connected side by side.

In this case, two side faces contacted together of each set of the semiconductor devices are connected together by electrically conductive paste.

As shown in FIG. 11(b), the terminals (or functional pins) provided in the semiconductor element 120 of the semiconductor device 401 and those provided in the semiconductor element 120M of the semiconductor device 405 are respectively arranged in reverse directions or into a mirror image. Therefore, such a semiconductor element 120M is also referred to as a mirror chip of the semiconductor element 120.

Although not shown, the layered and resin-sealed semiconductor device may also be constructed, by first orienting the two resin-sealed semiconductor devices, in directions respectively reverse to the directions shown in FIG. 11(a), then contacting and electrically connecting these two semiconductor devices side by side, so as to prepare such four sets of two semiconductor devices as described above.

In such a case, care should be taken for each terminal member 110, such that no circuit problem will occur in the connection between the reversed two side faces as well as in the connection via the bonding wire.

In FIGS. 11(a) and 11(b), P1 to P16 respectively designate functional pins (or terminals), in which like numerals designate like functions, respectively.

For instance, in FIG. 11(b), P1 designates a power source terminal, P2 denotes a select switch terminal, P3 to P7 and P9 to P16 respectively designate I/O terminals, and P8 is a ground terminal.

It should be appreciated that the number of layers in the layered resin-sealed semiconductor devices is not limited to four (4).

Additionally, the layered and resin-sealed semiconductor device may be constructed, by arranging and electrically connecting three or more resin-sealed semiconductor devices 101 shown in FIGS. 1 through 4, side by side, so as to prepare two or more sets of such three or more semiconductor devices 101, for forming a two or more-layer structure.

Moreover, each side face of such vertically layered resin-sealed semiconductor devices may be further connected with another device or system that will be contacted side by side.

Next, the manufacturing method for the resin-sealed semiconductor device will be described, with reference to FIG. 5.

First, resists 220 are provided on both sides of the material 210 (FIG. 5(a)) for processing. Corresponding to each position of the terminal members of each resin-sealed semiconductor device, the material 210 is etched on both sides, by using an etching method based on the half-etching technology. As a result, a processing sheet 210A including a plurality of connecting terminal members 230a, each composed of a pair of terminal members 230, can be obtained (FIG. 5(b)). Each pair of terminal members 230 is formed by connecting two external terminal portions 231 via the support portion 235. In this case, the connecting terminal members 230a are arranged on the processing sheet 210A, corresponding to each position of the terminal members 230 for each resin-sealed semiconductor device.

As the material 210 for processing, Cu, a Cu-based alloy, 42-alloy (42% Ni—Fe alloy) or the like material can be used, while a ferric chloride solution can be used as an etching solution.

As the resist, any suitable material can be used, provided that this material has a good etching resistance and exhibits a desired resolution and handling properties.

After the resists 220 are removed, the processing sheet 210A is subjected to cleaning or the like process. Then, the plated layer 210a for electrical connection is formed on the whole surface of the processing sheet 210A. In such a manner, the base material 210A for the semiconductor device, on which each semiconductor element 250 is not yet mounted, can be obtained by the processing sheet 210A.

Thereafter, one face, opposite to the half-etched face of the processing sheet 210A having the plurality of connecting terminal members 230a provided thereon, is drawn with vacuum, via the flat porous plate 240, such that the processing sheet 210 can be fixedly adhered to the porous plate 240 (FIG. 5(c)). Subsequently, the semiconductor element 250 is located in each predetermined position between the connecting terminal members 230a on the porous plate 240. Then, the rear face of each semiconductor element 250 is also drawn with vacuum, via the flat porous plate 240, such that the semiconductor element 250 can be fixedly mounted onto the porous plate 240 (FIG. 5(d)).

Although not shown, a vacuum pump, a vacuum line and a vacuum source, suitable for the porous plate 240, are separately provided.

Thereafter, the terminals 121 of each semiconductor element 250 and the terminal faces (i.e., the half-etched faces) of the internal terminal portions 232 of the terminal members 230 are connected together via the bonding wires 260 (FIG. 5(e)), respectively.

Next, the porous plate 240 is removed, and the molding tapes 270a, 271a are in turn provided to both faces of the processing sheet 210A so as to cover each face of the sheet 210A. Thereafter, the processing sheet 210A is grasped or held between the mold-fixing plates 270, 271, and a sealing resin is filled in a space between the mold-fixing plates 270, 271, so as to form the resin-sealing portion 280. Then, the front and rear mold-fixing plates 270, 271 are removed (FIG. 5(f)).

It is noted that the support portion 235 of each terminal member 230a on the processing sheet 210A includes a through-hole (or holes) or the like means, such that the sealing resin can pass through the hole when filled in the space.

Subsequently, the molding tapes 270a, 271a are peeled from the processing sheet 210A, and the cutting tape 275 is then attached to the processing sheet 210A (FIG. 5(g)). On the opposite side of the cutting tape 275 across the processing sheet 210A, the dicing saw (not shown) is actuated to cut the resin sealing portion 280 for each semiconductor element 250, so as to obtain the resin-sealed semiconductor device (FIG. 5(h)).

The cutting operation using the dicing saw (not shown) is performed in each position opposite to each recess 237 as shown in FIG. 5(h). Because each recess 237 is significantly thinned as compared with the thickness of the original material 210, the cutting operation can be performed with ease.

For example, the cutting operation using the dicing saw (not shown) is performed in such a manner as shown in FIG. 12(a) and/or 12(b).

In FIG. 12, each unit resin-sealed semiconductor device 301 is depicted as an area divided by cutting lines 385. Although not shown for better understanding, each support portion 235 shown in FIG. 5 is cut on the opposite side of each recess 237.

In some cases, the processing sheet 310A is also referred to as a frame.

Each cut surface formed in the cutting operation will be an outer side face 231c of each external terminal 231 of the resin-sealed semiconductor device that will be manufactured.

Other faces of each notched portion 237A than the cut surface are respectively provided with suitable plating in order to facilitate the electrical connection.

In this way, the resin-sealed semiconductor device shown in FIG. 1 can be manufactured.

In the manufacturing method shown in FIG. 5, each semiconductor element 250 is connected with the terminal members 230 via the bonding wires 260 on the porous plate 240. Therefore, there is no need for preparing an additional adhesive tape, thus eliminating a cost for such an expensive tape for manufacturing the resin-sealed semiconductor device.

Next, another example of the manufacturing method for the resin-sealed semiconductor device will be described, with reference to FIG. 6.

First, resists 320 are provided on both sides of the material 310 (FIG. 6(a)) for processing. Corresponding to each position of the terminal members of each resin-sealed semiconductor device, the material 310 is etched on both sides, by using an etching method based on the half-etching technology. As a result, the processing sheet 310A including a plurality of connecting terminal members 330a, each composed of a pair of terminal members 330, can be obtained (FIG. 6(b)). Each pair of terminal members 330 is formed by connecting two external terminal portions 331 via the support portion 335. In this case, the connecting terminal members 330a are arranged on the processing sheet 310A, corresponding to each position of the terminal members 330 for each resin-sealed semiconductor device.

After the resists 320 are removed, the processing sheet 310A is subjected to a cleaning process or the like. Then, the plated layer 310a is formed onto the whole surface of the processing sheet 310A. In this manner, the base material 310 for the semiconductor device, on which each semiconductor element 350 is not yet mounted, can be prepared by the processing sheet 310A.

Thereafter, the molding tape 340 is attached to one face opposite to the half-etched face of the processing sheet 310A having the plurality of connecting terminal members 330a provided thereon (FIG. 6(c)). Subsequently, the semiconductor element 350 is located in each predetermined position between the connecting terminal members 330a on the molding tape 340. Thereafter, the rear face of each semiconductor element 350 is attached and mounted onto the tape 340 (FIG. 6(d)).

Then, the terminals 121 of each semiconductor element 350 and the terminal faces of the internal terminal portions of the terminal members 330 are connected together via the bonding wires 360, respectively (FIG. 6(e)).

Next, the molding tape 341 is flatly attached to a face opposite to the tape 340 of the processing sheet 310A. Thereafter, the processing sheet 310A is grasped or held between the mold-fixing plates 371, 372 via the tapes 340, 341, and a sealing resin is filled in a space between the mold-fixing plates 370, 371, so as to form the resin-sealing portion 380 (FIG. 6f).

In this case, the tape, on which each semiconductor element 350 is attached and located in each predetermined position, can be used, directly, as the tape for the molding.

Thereafter, the mold-fixing plates 371, 372 are removed from the processing sheet 310A (FIG. 6(g)), and then the tapes 340, 341 are removed therefrom. Subsequently, the cutting tape 345 is attached to the processing sheet 310A (FIG. 6(h)). On the opposite side of the cutting tape 345 across the processing sheet 310A, the dicing saw (not shown) is actuated to cut the resin sealing portion 380 for each semiconductor element 350 (FIG. 6(i)), so as to obtain the resin-sealed semiconductor device (FIG. 6(j)).

Also in the manufacturing method shown in FIG. 6, a process in each step and each member or part used therein are substantially the same as those described in the manufacturing method shown in FIG. 5. Therefore, explanation on these points has been omitted.

In this manner, the resin-sealed semiconductor device as the first embodiment shown in FIG. 1 can be manufactured.

It should be noted that the examples of the manufacturing method for the resin-sealed semiconductor device, respectively shown in FIGS. 5 and 6, can also be applied to the manufacture of the resin-sealed semiconductor device shown in FIG. 3 as well as the resin-sealed semiconductor device shown in FIG. 4.

The invention claimed is:

1. A resin-sealed semiconductor device, comprising:
   a semiconductor element;
   a plurality of terminal members, each surrounding the semiconductor element and including an external terminal portion connected with an external circuit, an internal terminal portion connected with the semiconductor element, and a connecting portion connecting the external terminal portion with the internal terminal portion;
   bonding wires, each electrically connecting the semiconductor element with the internal terminal portion of each terminal member; and
   a resin-sealing portion sealing the semiconductor element, terminal members and bonding wires,
   wherein each terminal member has a flat rear face and two stepwise front faces and is composed of an inner thinned portion forming the internal terminal portion and an outer thickened portion forming the external terminal portion,
   wherein a rear face of each internal terminal portion, a front face of each external terminal portion, a rear face of the external terminal portion and an outer side face of the external terminal portion are respectively exposed to the outside from the resin-sealing portion, and
   wherein a recess is formed in the inner side face of each internal terminal portion, in the inner cross section parallel to a longitudinal direction thereof.

2. The resin-sealed semiconductor device according to claim 1, wherein each terminal member is formed by etching a material for processing, and wherein the external terminal portion is formed into the thickened portion by keeping a thickness of the material, while the internal terminal portion is formed into the thinned portion by half-etching a front face of the material.

3. The resin-sealed semiconductor device according to claim 2, wherein a notched portion is formed in an outer upper portion of each external terminal portion, and wherein the periphery of the front face of the external terminal portion is located inside the outer side face thereof.

4. The resin-sealed semiconductor device according to claim 3, wherein the resin-sealing portion is filled in the notched portion of the external terminal portion.

5. The resin-sealed semiconductor device according to claim 1, wherein an acute angle is formed between a front face and an inner side face of each internal terminal portion, in an inner cross section parallel to a longitudinal direction thereof.

6. The resin-sealed semiconductor device according to claim 1, wherein the internal terminal portion includes the material for processing and a plated layer formed on the material, such that the recess is formed in the inner side face of the internal terminal portion, in the inner cross section thereof.

7. The resin-sealed semiconductor device according to claim 1, wherein a cross-sectional shape orthogonal to the longitudinal direction of each internal terminal portion is an inverted trapezoidal shape.

8. The resin-sealed semiconductor device according to claim 1, wherein an inner end portion of each internal terminal portion is tapered when seen in a plan view thereof.

9. The resin-sealed semiconductor device according to claim 1, wherein a face-roughening process is provided to faces of the internal terminal portion and external terminal portion of each terminal member that will be contacted with the resin-sealing portion.

10. The resin-sealed semiconductor device according to claim 9, wherein the maximum height roughness Ry (JISBO601-1994) of each face subjected to the face-roughening process is within a range of from 1 μm to 2 μm.

11. The resin-sealed semiconductor device according to claim 1, wherein each terminal member is formed from Cu, a Cu-based alloy or 42% Ni—Fe alloy.

12. The resin-sealed semiconductor device according to claim 1, wherein a metal-plated layer for electrical connection, which is selected from the group consisting of a solder-plated layer, a gold-plated layer, a silver-plated layer, a palladium-plated layer and a tin-plated layer, is provided to the front face of each internal terminal portion and the front and rear faces of each external terminal portion.

13. The resin-sealed semiconductor device according to claim 1, wherein the thickness of the semiconductor element is 100 μm or less.

14. The resin-sealed semiconductor device according to claim 1, wherein the semiconductor device is of a QFN type.

15. A base material for a semiconductor device, comprising:
a plurality of terminal members, each including an external terminal portion, an internal terminal portion, and a connecting portion connecting the external terminal portion with the internal terminal portion,
wherein each terminal member has a flat rear face and two stepwise front faces and is composed of an inner thinned portion forming the internal terminal portion and an outer thickened portion forming the external terminal portion, and
wherein a recess is formed in the inner side face of each internal terminal portion, in the inner cross section thereof.

16. The base material for the semiconductor device according to claim 15, wherein each terminal member is formed by etching a material for processing, and wherein the external terminal portion is formed into the thickened portion by keeping a thickness of the material, while the internal terminal portion is formed into the thinned portion by half-etching or deep-etching a front face of the material.

17. The base material for the semiconductor device according to claim 16, wherein a notched portion is formed in an outer upper portion of each external terminal portion, and wherein the periphery of a front face of the external terminal portion is located inside the outer side face thereof.

18. The base material for the semiconductor device according to claim 15, wherein an acute angle is formed between a front face and an inner side face of each internal terminal portion, in an inner cross section parallel to a longitudinal direction thereof.

19. The base material for the semiconductor device according to claim 15, wherein the internal terminal portion includes the material for processing and a plated layer formed on the material, such that the recess is formed in the inner side face of the internal terminal portion, in the inner cross section thereof.

20. The base material for the semiconductor device according to claim 15, wherein a cross-sectional shape orthogonal to the longitudinal direction of each internal terminal portion is an inverted trapezoidal shape.

21. The base material for the semiconductor device according to claim 15, wherein an inner end portion of each internal terminal portion is tapered when seen in a plan view thereof.

22. The base material for the semiconductor device according to claim 15, wherein a face-roughening process is provided to faces of the internal terminal portion and external terminal portion of each terminal member that will be contacted with the resin-sealing portion.

23. The base material for the semiconductor device according to claim 15, wherein the maximum height roughness Ry (JISBO601-1994) of each face subjected to the face-roughening process is within a range of from 1 μm to 2 μm.

24. The base material for the semiconductor device according to claim 15, wherein each terminal member is formed from Cu, a Cu-based alloy or 42% Ni—Fe alloy.

25. The base material for the semiconductor device according to claim 15, wherein a metal-plated layer for electrical connection, which is selected from the group consisting of a solder-plated layer, a gold-plated layer, a silver-plated layer, a palladium-plated layer and a tin-plated layer, is provided to the front face of each internal terminal portion and the front and rear faces of each external terminal portion.

* * * * *